(12) United States Patent
Chang-Hasnain et al.

(10) Patent No.: US 6,275,513 B1
(45) Date of Patent: Aug. 14, 2001

(54) HERMETICALLY SEALED SEMICONDUCTOR LASER DEVICE

(75) Inventors: Constance Chang-Hasnain, Union City; Renato Dato, Pleasanton; Philip Worland, San Jose; Rang-Chen Yu, San Jose, all of CA (US)

(73) Assignee: Bandwidth 9, Fremont, CA (US)

( * ) Notice: Subject to any disclaimer, the term of this patent is extended or adjusted under 35 U.S.C. 154(b) by 0 days.

(21) Appl. No.: 09/326,159

(22) Filed: Jun. 4, 1999

(51) Int. Cl.⁷ ........................................... H01S 3/10
(52) U.S. Cl. .................. 372/20; 372/43; 372/36; 372/81; 372/66; 372/107
(58) Field of Search .............. 372/20, 107, 36, 372/43, 81, 66, 49

(56) References Cited

U.S. PATENT DOCUMENTS

| | | |
|---|---|---|
| H147 | 11/1986 | Feldman et al. ............. 357/47 |
| 4,244,045 | 1/1981 | Nosu et al. ............. 370/3 |
| 4,493,113 | 1/1985 | Forrest et al. ............. 455/606 |
| 4,577,207 | 3/1986 | Copeland ............. 357/17 |
| 4,577,209 | 3/1986 | Forrest et al. ............. 357/30 |
| 4,595,454 | 6/1986 | Dautremont-Smith et al. ..... 156/647 |

(List continued on next page.)

FOREIGN PATENT DOCUMENTS

| | | | |
|---|---|---|---|
| 0 421 674 A2 | 4/1991 | (EP) | H02S/3/096 |
| 0 570 243 A1 | 11/1993 | (EP) | H01S/3/139 |
| 0 818 857 A1 | 1/1998 | (EP) | H01S/1/00 |
| 0 829 934 A1 | 3/1998 | (EP) | H01S/3/085 |

OTHER PUBLICATIONS

Goldstein, L. et al., "Metamorphic GaAs/AlAs Bragg deposited on InP for 1,3/1,55μm vertical cavity lasers" Centre D'Elaboration des Materiaux et d'Etudes Structurales.

Lambert, B. et al., High Reflectivity 1.55μm (Al) GaAsSb/AlAsSb Bragg Reactor Lattice Matched on InP Substrates; France Telecom CNET Lab/Rio; Jul. 19, 1994.

Anan, T. et al., Improved Reflectivity of AIPSb/GaPSb Bragg Reflector for 1.55μm Wavelength; Electronics Letters; Dec. 8, 1994, vol. 30, No. 25.

Blum, O. et al., Digital Alloy AlAsSb/AlGaAsSb Distributed Bragg Reflectors Lattice Matched to InP For 1.3–1.55 μm Wavelength Range; Electronics Letters; Jul. 20, 1995, vol. 31, No. 15.

Toshikazu, H. et al., "Optical Element Mounting Body", *Patent Abstracts of Japan,* vol. 1999, No. 09, Jul. 30, 1999, (JP 11 097797A, Apr. 9, 1999).

Tetsuya, K., "Semiconductor Device", *Patent Abstracts of Japan,* vol. 1998, No. 09, Jul. 31, 1998, (JP 10 112520A, Apr. 28, 1998).

Susumu, I., "Assembly of Semiconductor Device", *Patent Abstracts of Japan,* vol. 013, No. 386, Aug. 25, 1989, (JP 01 134956A, May 26, 1989).

Mikio, Y., "Circuit for Stabilizing Oscillating Wavelength of Laser Diode", Patent Abstracts of Japan, vol. 014, No. 163, Mar. 29, 1990, (JP02020084).

Ishii, H. et al., "Wavelength stabilisation of a three–electrode distributed Bragg reflector laser with longitudinal mode control", Electronics Letters, vol. 33, No. 6, Mar. 13, 1997, pp. 494–496.

*Primary Examiner*—Leon Scott, Jr.
(74) *Attorney, Agent, or Firm*—Wilson Sonsini Goodrich & Rosati (57) ABSTRACT

A wafer assembly that includes a wafer substrate. A plurality of micro-optomechanical or micro-optoelectrical devices are positioned on a surface of the wafer substrate. Each micro-optomechanical or micro-optoelectrical device has a seal surface. A plurality of seal caps are coupled to the micro-optomechanical or micro-optoelectrical devices. Each seal cap has a seal ring. The seal cap seal ring is coupled to a seal surface of the micro-optomechanical or micro-optoelectrical device to form a hermetic seal.

55 Claims, 7 Drawing Sheets

U.S. PATENT DOCUMENTS

| | | | |
|---|---|---|---|
| 4,605,942 | 8/1986 | Camlibel et al. | 357/17 |
| 4,660,208 | 4/1987 | Johnston, Jr. et al. | 372/46 |
| 4,700,210 | 10/1987 | Burton et al. | 357/17 |
| 4,709,413 | 11/1987 | Forrest et al. | 455/606 |
| 4,756,590 | 7/1988 | Forrest et al. | 350/96.15 |
| 4,768,070 | 8/1988 | Takizawa et al. | 357/17 |
| 4,774,554 | 9/1988 | Dentai et al. | 357/17 |
| 4,824,200 | 4/1989 | Isono et al. | 350/96.16 |
| 4,843,280 | 6/1989 | Lumbard et al. | 313/500 |
| 4,888,624 | 12/1989 | Johnston, Jr. et al. | 357/16 |
| 4,949,350 | 8/1990 | Jewell et al. | 372/45 |
| 4,991,179 | 2/1991 | Deppe et al. | 372/45 |
| 4,999,315 | 3/1991 | Johnston, Jr. et al. | 439/94 |
| 4,999,842 | 3/1991 | Huang et al. | 372/45 |
| 4,999,843 | 3/1991 | Luryi et al. | 372/45 |
| 5,005,935 | 4/1991 | Kunikane et al. | 350/96.16 |
| 5,018,157 | 5/1991 | Deppe et al. | 372/45 |
| 5,034,344 | 7/1991 | Jewell et al. | 437/129 |
| 5,034,958 | 7/1991 | Kwon et al. | 372/45 |
| 5,063,569 | 11/1991 | Xie | 372/45 |
| 5,068,868 | 11/1991 | Deppe et al. | 372/45 |
| 5,073,041 | 12/1991 | Rastani | 385/33 |
| 5,101,460 | 3/1992 | Richard | 385/37 |
| 5,102,812 | 4/1992 | Caneau et al. | 437/32 |
| 5,104,824 | 4/1992 | Clausen et al. | 437/90 |
| 5,115,441 | 5/1992 | Kopf et al. | 372/45 |
| 5,135,605 | 8/1992 | Blonder et al. | 156/628 |
| 5,136,603 | 8/1992 | Hasnain et al. | 372/50 |
| 5,146,078 | 9/1992 | Luryi | 250/213 |
| 5,158,908 | 10/1992 | Blonder et al. | 437/129 |
| 5,164,949 | 11/1992 | Ackley et al. | 372/45 |
| 5,170,407 | 12/1992 | Schubert et al. | 372/96 |
| 5,171,704 | 12/1992 | Abernathy et al. | 437/81 |
| 5,182,787 | 1/1993 | Blonder et al. | 385/131 |
| 5,206,526 | 4/1993 | Liu et al. | 257/185 |
| 5,206,871 | 4/1993 | Deppe et al. | 372/45 |
| 5,206,872 | 4/1993 | Jewell et al. | 372/45 |
| 5,212,701 | 5/1993 | Choquette et al. | 372/45 |
| 5,212,702 | 5/1993 | Choquette | 372/45 |
| 5,214,838 | 6/1993 | Cho et al. | 437/105 |
| 5,216,686 | 6/1993 | Holm et al. | 372/45 |
| 5,216,727 | 6/1993 | Vakhshoori et al. | 385/14 |
| 5,223,723 | 6/1993 | Luryi | 257/184 |
| 5,226,053 | 7/1993 | Cho et al. | 372/45 |
| 5,227,006 | 7/1993 | Abernathy et al. | 156/613 |
| 5,244,749 | 9/1993 | Bean et al. | 428/620 |
| 5,257,648 | 11/1993 | Woo | 257/185 |
| 5,258,316 | 11/1993 | Ackley et al. | 437/24 |
| 5,262,360 | 11/1993 | Holonyak, Jr. et al. | 437/237 |
| 5,281,542 | 1/1994 | Hui et al. | 437/2 |
| 5,288,657 | 2/1994 | Feygenson et al. | 437/90 |
| 5,291,502 | 3/1994 | Pezeshki et al. | 372/20 |
| 5,311,526 | 5/1994 | Gorfinkel et al. | 372/26 |
| 5,316,968 | 5/1994 | Choquette | 437/105 |
| 5,317,587 | 5/1994 | Ackley et al. | 372/45 |
| 5,323,416 | 6/1994 | Bhat et al. | 372/99 |
| 5,328,854 | 7/1994 | Vakhshoori et al. | 437/24 |
| 5,331,658 | 7/1994 | Shieh et al. | 372/50 |
| 5,337,327 | 8/1994 | Ackley | 372/45 |
| 5,343,490 | 8/1994 | McCall | 372/94 |
| 5,348,912 | 9/1994 | Choquette et al. | 437/129 |
| 5,351,257 | 9/1994 | Lebby et al. | 372/48 |
| 5,351,261 | 9/1994 | Lanzerotti et al. | 372/98 |
| 5,351,262 | 9/1994 | Poguntke et al. | 372/102 |
| 5,355,385 | 10/1994 | Amano et al. | 372/49 |
| 5,362,977 | 11/1994 | Hunt et al. | 257/98 |
| 5,387,543 | 2/1995 | Ackley | 437/129 |
| 5,418,183 | 5/1995 | Joyner et al. | 437/129 |
| 5,446,752 | 8/1995 | Ackley et al. | 372/46 |
| 5,448,587 | 9/1995 | Huang | 372/107 |
| 5,457,760 | 10/1995 | Mizrahi | 385/37 |
| 5,493,577 | 2/1996 | Choquette et al. | 372/46 |
| 5,495,360 | 2/1996 | Yoo | 359/248 |
| 5,498,883 | 3/1996 | Lebby et al. | 257/95 |
| 5,574,744 | 11/1996 | Gaw et al. | 372/50 |
| 5,614,436 | 3/1997 | Shim et al. | 437/129 |
| 5,619,609 | 4/1997 | Pan et al. | 385/136 |
| 5,629,951 | 5/1997 | Chang-Hasnain et al. | 372/20 |
| 5,638,392 | 6/1997 | Ramdani et al. | 372/45 |
| 5,659,640 | 8/1997 | Joyner | 385/14 |
| 5,661,075 | 8/1997 | Grodzinski et al. | 438/32 |
| 5,677,924 | 10/1997 | Bestwick | 372/96 |
| 5,696,023 | 12/1997 | Holonyak et al. | 437/133 |
| 5,719,891 | 2/1998 | Jewell | 372/45 |
| 5,719,893 | 2/1998 | Jiang et al. | 372/45 |
| 5,737,104 | 4/1998 | Lee et al. | 359/124 |
| 5,742,630 | 4/1998 | Jiang et al. | 372/50 |
| 5,748,350 | 5/1998 | Pan et al. | 359/130 |
| 5,751,757 | 5/1998 | Jiang et al. | 372/50 |
| 5,757,836 | 5/1998 | Jiang et al. | 372/50 |
| 5,760,419 | 6/1998 | Nabiev et al. | 357/12 |
| 5,764,671 | 6/1998 | Lebby et al. | 372/45 |
| 5,764,679 | 6/1998 | Shen et al. | 372/69 |
| 5,805,624 | 9/1998 | Yang et al. | 372/45 |
| 5,812,577 | 9/1998 | Dawson et al. | 372/46 |
| 5,903,586 | 5/1999 | Ramdani et al. | 372/45 |
| 5,978,408 | 11/1999 | Thornton | 372/96 |

HERMETICALLY SEALED SEMICONDUCTOR LASER DEVICE

BACKGROUND OF THE INVENTION

1. Field of the Invention

This invention relates generally to semiconductor laser assemblies, and more particularly to semiconductor lasers that hermetically sealed with a seal cap.

2. Description of Related Art

A variety of devices are formed on wafers including but not limited to lasers, photodetectors, filters electronic circuits and MEMs. These devices are formed on the wafers utilizing a variety of standard multi-processing steps and procedures. The wafer is typically moved from one process station to another until the final device is completed on the wafer. The devices are then tested. Following testing, the wafer is diced and individual devices are then mounted, electrical connections are made and then there is a final sealing.

This type of wafer scale manufacturing exposes the individual devices to contaminants and corrosive elements found in the atmosphere because of the lengthy time it takes to complete the manufacturing process. Corrosive elements, such as moisture and oxygen, can cause a degradation in the device that is made.

Laser diodes typically include an n-type substrate, an active layer, a p-type clad layer and a p-type cap layer that is laminated over the n-type substrate. In one such semiconductor laser, the n-type substrate is formed of AlGaAs and the active layer is formed of GaAs. An electrode is selectively formed on the obverse surface of the laser diode in an opening of the p-type cap layer. A rear electrode is formed on the reverse surface of the substrate. The resulting structure is a laser diode chip more commonly known as a double heterostructure (DH structure). This laser diode chip can be mounted on a radiation plate. The assembly is then encapsulated to hermetically seal the device. Different methods of encapsulation include the use of metal packages or caps with a light transmitting window, lenses or optical fibers. Wafer scale encapsulation is used on low power light emitting devices where the devices are typically encapsulated with an encapsulating resin layer typically formed of a transparent epoxy resin or the like.

Because the epoxy resin abuts directly against a light-emitting end face of the laser diode from which an output beam is emitted, the resin can become decomposed due to the heat from the output beam. As the degradation increases, the light emission efficiency of the laser diode declines. In some cases, the promoted decomposition results in the formation of a cavity in the encapsulating resin layer in the vicinity of the light-emitting end face.

In one diode laser chip, the output beam has a power 5 mW and an oscillation wavelength of 780 nm is continuously oscillated in a state close to its maximum rating. A conical broken area with a bottom diameter is formed in the encapsulating resin layer in the vicinity of the light-emitting end face after about 1000 hours of operation. Additionally, the encapsulating resins layer often melts and breaks.

There is a need for improvement in wafer scale manufacturing processes and procedures along with the resultant devices that are created. There is a further need to seal the individual devices on the wafer before corrosive environment elements create a degradation.

SUMMARY OF THE INVENTION

Accordingly, an object of the present invention is to provide sealed micro-optomechanical, micro-electromechanical and micro-optoelectrical devices.

Another object of the present invention is to provide micro-optomechanical, micro-electromechanical and micro-optoelectrical devices that are sealed at the wafer level.

A further object of the invention is to provide a wafer assembly of a plurality of micro-optomechanical, micro-electromechanical or micro-optoelectrical devices formed and individually sealed on the wafer.

Yet another object of the present invention is to provide a wafer sealed tunable semiconductor laser assembly.

These and other objects of the present invention are achieved in a wafer assembly that includes a wafer substrate. A plurality of micro-optomechanical, micro-electromechanical or micro-optoelectrical devices are positioned on a surface of the wafer substrate. Each micro-optomechanical, micro-electromechanical or micro-optoelectrical device has a seal surface. A plurality of seal caps are coupled to the micro-optomechanical, micro-electromechanical or micro-optoelectrical devices. Each seal cap has a seal ring. The seal cap seal ring is coupled to a seal surface of the micro-optomechanical, micro-electromechanical or micro-optoelectrical device to form a hermetic seal.

In another embodiment, a tunable semiconductor laser assembly includes a laser with a seal surface. A semiconductor active region is positioned between upper and lower confining regions of an opposite type semiconductor material. First and second reflective members are positioned at opposing edges of the active and confining regions. A seal cap is provided which includes a seal ring. The seal cap seal ring is coupled to the seal surface to form a hermetic seal.

In another embodiment, a tunable semiconductor laser assembly includes a heatsink. A laser is coupled to the heatsink. The laser includes a semiconductor active region positioned between upper and lower confining regions of opposite type semiconductor material. First and second reflective members are positioned at opposing edges of the active and confining regions. A seal cap includes a seal ring. The seal cap seal ring is coupled to the seal surface to form a hermetic seal.

DETAILED DESCRIPTION

Figure 1:
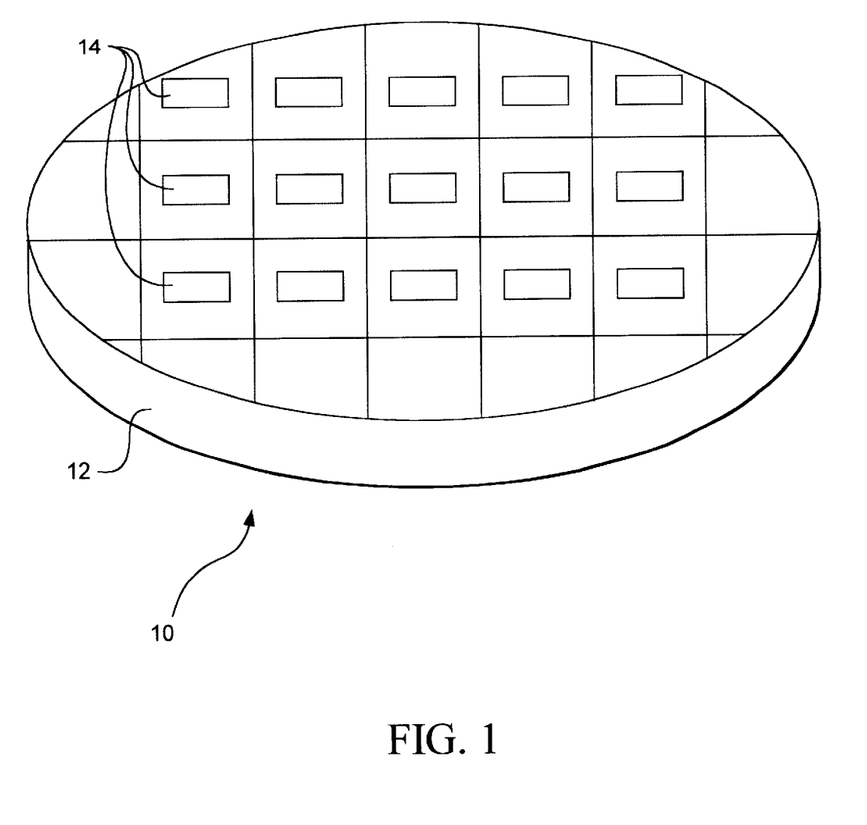
FIG. 1 is a perspective view of one embodiment of a wafer assembly of the present invention.

Referring to FIG. 1, a wafer assembly 10 includes a wafer substrate 12 and a plurality of micro-optomechanical, micro-electromechanical, micro-optoelectronic, micro-optical or micro-electronic devices 14, positioned on a surface 16 of substrate 12. Devices 14 include but are not limited to lasers, particularly tunable VCSEL's, photodetectors, filters, etalons, circuits, heatsinks and the like. Devices 14 are made by conventional methods well know to those skilled in the art including but not limited to, chemical vapor deposition (CVD), molecular beam epitaxy (MBE), metal-organic chemical vapor deposition (MOCVD), wet and dry etching processes, regrowth and the like.

In one embodiment, substrate 12 can include from 1 to several thousand individual devices 14. The number of devices 14 can vary. On any one substrate 12, it is preferred that all individual devices 14 are identical. However, different types of devices 14 can be formed on the same substrate 12. One suitable device 14 is a microlaser including but not limited to a VCSEL, as more fully described hereafter.

Figure 2A:
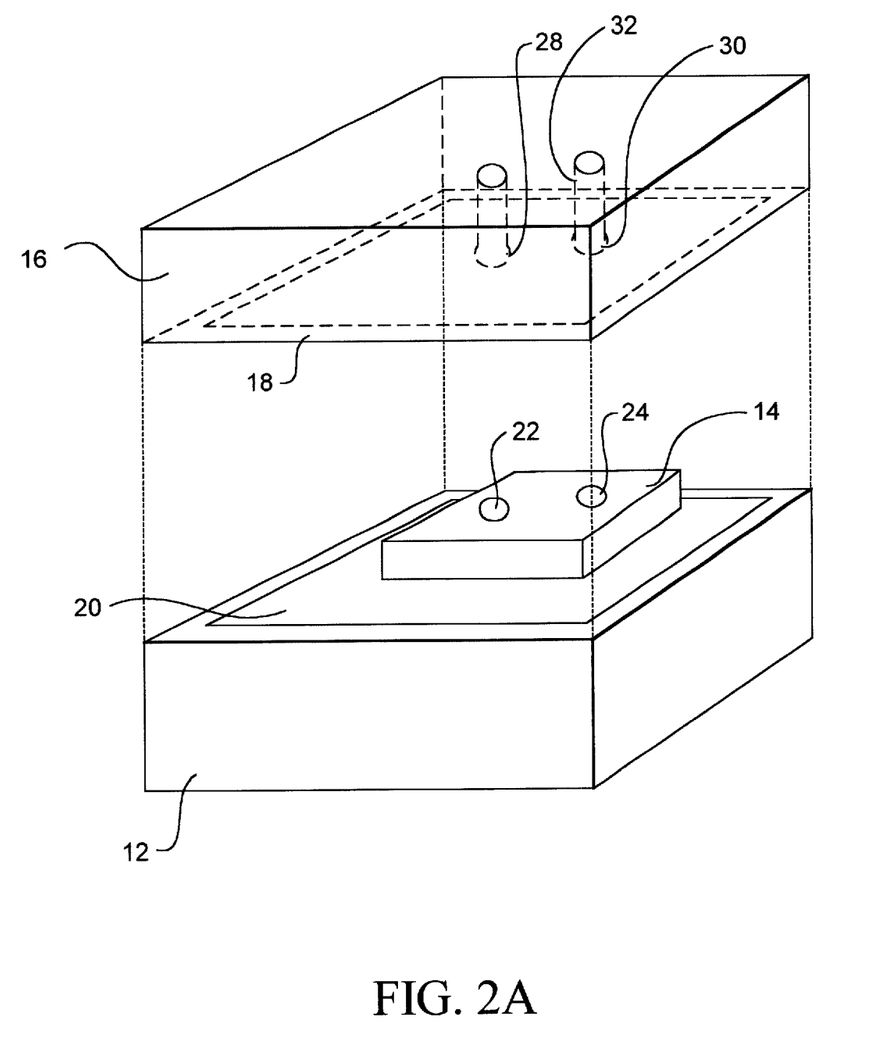
FIG. 2(a) is an exploded perspective view of one embodiment of the present invention with a micro-optomechanical, micro-electromechanical or micro-optoelectronic device positioned on a substrate with a seal cap.
Figure 2B:
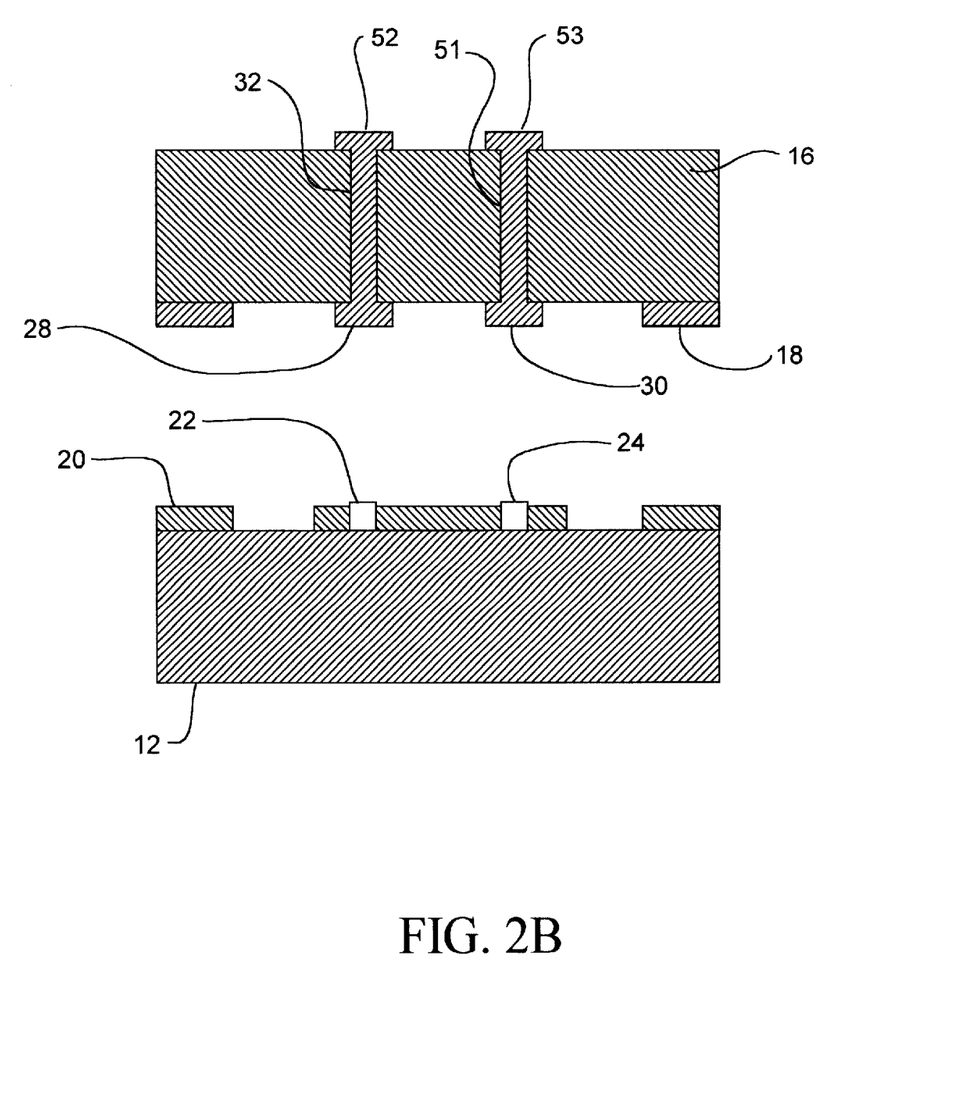
FIG. 2(b) is a side perspective view of the embodiment illustrated in FIG. 2(a).

As shown in FIGS. 2(a) and 2(b), each device 14 positioned on substrate 12 has a seal cap 16 with a seal ring 18. Seal cap 16 is distanced from devices 14 and is not positioned on a surface of device 14. Seal rings 18 are joined to a seal surface 20 of each device 14 and form a hermetic seal that is impervious to air. In one embodiment, the hermetic seal has a leak rate of no more than $1 \times 10^{-7}$ cc of air/sec at 1 atm differential pressure.

A joining material is used to seal cap 16 and substrate 12, Suitable joining materials include but are not limited to solder, adhesives and the like. The joining material is preferably electrically conductive.

Cap 16 can be made of a polymer, a multi-layer ceramic, a single crystal material, or another semiconductor device. Additionally, cap 16 can include conductive traces. The conductive traces can be formed by methods well known to those skilled in the art.

Deposited onto the top of substrate 12, which is electrically insulating, is a pattern of highly conductive material. The conductive pattern on the top side of substrate 12 defines the connections pads 52 and 53. Deposited on the opposite, bottom side of substrate 12 is a second conductive pattern of highly conductive material. This defines two contact pads 28 and 30 and the seal ring 18. Contact pads 52 and 53 are coated with a layer of solder or conductive adhesive to provide the electrical contact to contact pads 22 and 24. Seal ring 18 is also coated with the same layer of solder or conductive adhesive to provide the seal. Seal ring 18 can be coated with a different material that applied to contact pads 52 and 53.

Contact pads 52 and 53 are electrically connected to contact pads 22 and 24 by apertures 32 and 51 that are filled with an electrically conductive material. This material also seals apertures 32 and 51. In this manner, contact pads 52 and 53 serve as external terminals to device 14.

Sealing cap 16 and substrate 12 on a wafer scale offers numerous advantages. Device 14 is protected from environmental degradation at a early stage in the fabrication process. Additionally, wafer level testing is done without contaminating devices 14. Sealing devices 14 on a wafer level reduces degradation of device 14 by oxygen, moisture and the like. The delicate structures of any device 14 are protected from degradation at a very early stage. Devices 14 are then less fragile and easier to handle due to the early sealing. During the sealing process, an inert gas can be sealed inside the cavity to improve thermal performance and to dampen vibration on a cantilever 40.

Each device 14 includes at least first and second electrical contact pads 22 and 24. When device 14 is a semiconductor laser, contact pads can be positioned at a surface of semiconductor laser 14, preferably adjacent to the active area of the laser. One specific type of a semiconductor laser 14 of the present invention is a VCSEL, illustrated in FIG. 3. One preferred embodiment of a suitable VCSEL 14 is described below. It will be appreciated that the present invention is not limited to VCSEL devices 14.

Figure 3:
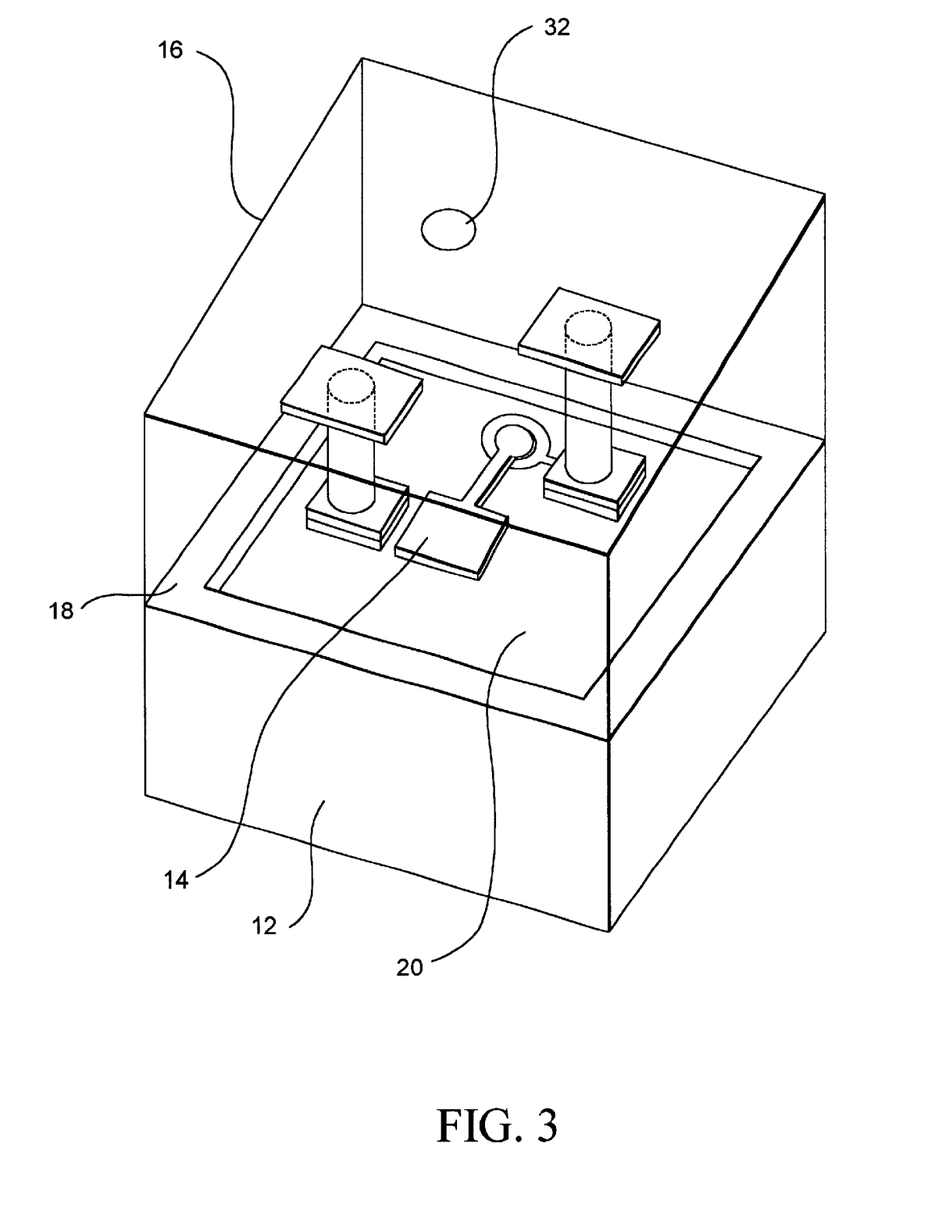
FIG. 3 is a top down perspective view of one embodiment of the present invention illustrating a microlaser positioned on a substrate and sealed with a seal cap made of a transparent material.
Figure 4:
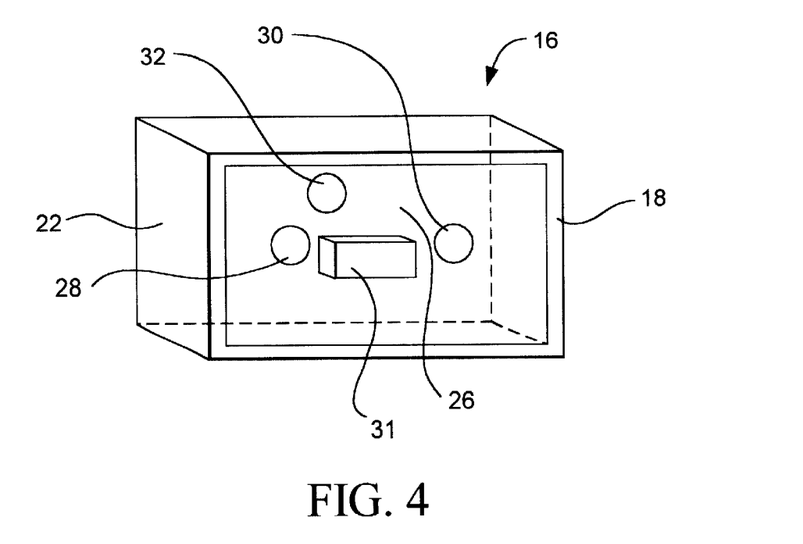
FIG. 4 is a perspective view of an interior of a seal cap used with the present invention illustrating the inclusion of contact pads that are formed on an interior surface of the seal cap.

Referring now to FIG. 3, cap 16 includes a surface 26, shown in FIG. 4, that becomes an interior surface when device 14 is sealed with cap 16. As previously mentioned, surface 26 remains distanced from the top of device 14.

Referring now to FIG. 4, first and second contact pads 28 and 30 are formed on surface 26. Optionally formed or mounted on surface 26 is a semiconductor device 31 including but not limited to one or more tunable or non-tunable photodiodes, etalons, tunable or non-tunable filters, tunable or non-tunable attenuators or semiconductor devices with driver circuitry. In one embodiment, device 14 is a microlaser and semiconductor device 31 is a photodiode or an etalon. A more complete description of this embodiment is described in U.S. Patent Application, Ser. No. 09/326,126 now U.S. Pat. No. 6,238,263 filed Jun. 4, 1999 on the same date as this application and incorporated herein by reference. In other embodiments, device 14 is a laser as disclosed in U.S. Patent Application Ser. No. 08/326,010, filed Jun. 24, 1999 on the same date as this application and incorporated herein by reference.

Contact pads 28 and 30 are positioned to be electrically engaged with contact pads 22 and 24. In one embodiment, contact pads 22 and 24 are made of a first material, while contact pads 28 and 30 are made of a second, different material. Suitable materials include but are not limited to, tin, gold and the like. The first and second materials of contact pads 22, 24, 28 and 30 can form an alloy when joined together.

Seal cap includes a conductive via 32 that includes an electrically conductive material. Contact pads 24 and 26, as well as device 14 are electrically coupled to conductive via 32.

Figure 5:
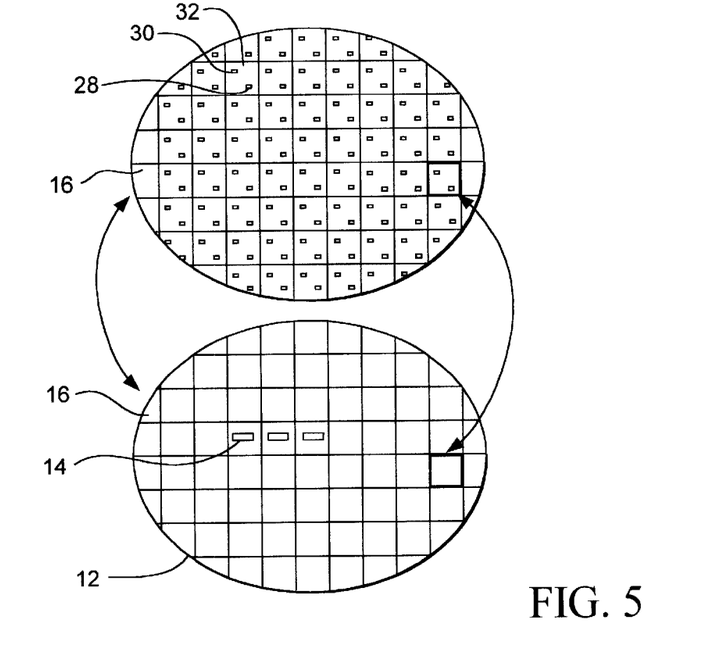
FIG. 5 is an exploded perspective view on one embodiment of a wafer assembly of the present invention illustrating a substrate with a plurality of micro-optomechanical, micro-electromechanical or micro-optoelectronic devices and a seal cap with a plurality of contact pads.
Figure 6:
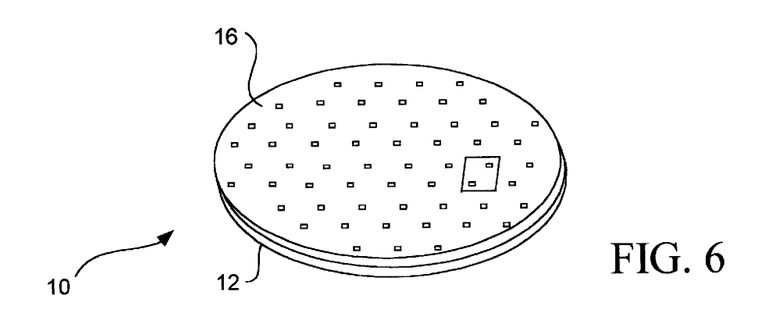
FIG. 6 is a perspective view of the wafer assembly of FIG. 5 with the seal cap coupled to the substrate.
Figure 7:
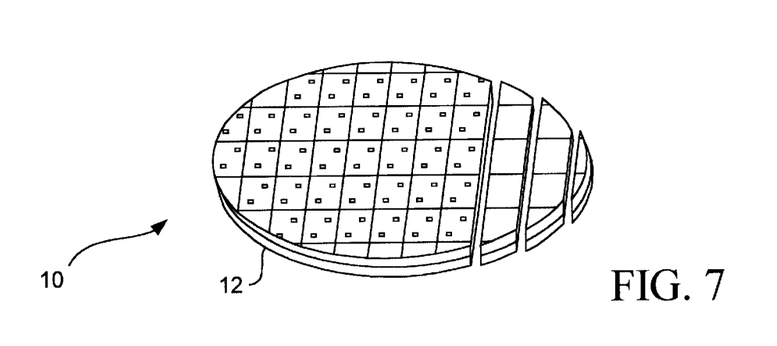
FIG. 7 is a perspective view of the wafer assembly of FIG. 6 illustrating the sawing of the wafer assembly into individual components.

Referring now to FIGS. 5–7, the assembly of substrate with cap 16 to form wafer assembly 10 is illustrated. In one embodiment, EPI layers are deposited on surface 20 of substrate 12. Substrate is made of silicon, InP, GaAs, and the like. Substrate 12 goes from processing to processing station until devices 14 are made. Another wafer is used as cap 16. Cap 16 is made of silicon, InP, GaAs, or any single crystal material.

Vias 32 are drilled in cap 16 and are then filled with a conductor such as metal. Preferred conductors include but are not limited to gold, tin, lead, silver and the like. Substrate 12 and cap 16 are metallized and etched to create a desired pattern, as illustrated in FIG. 5. This is then followed by deposition of the joining material in seal ring 18 and also on contact pads 22, 24, 28 and 30.

Substrate 12 and cap 16 are aligned and heated in a furnace where the joining material is cured if it is an epoxy, of melts if it is a solder. As previously mentioned, other types of joining materials can be utilized and the actual mechanism of sealing in the furnace depends on the type of joining material. A downward pressure can be applied during the sealing step. A cool down process then begins. FIG. 6 illustrates the sealed wafer assembly 10. Sealed wafer assembly 10 can have atmosphere, an inert gas, or any other type of gas in individual sealed assemblies of assembly 10. Sealed wafer assembly 10 is then separated into individual components or arrays of components by sawing, scribing and breaking and the like, as shown in FIG. 7. Other methods of separation include but are not limited to laser cutting.

Figure 8:
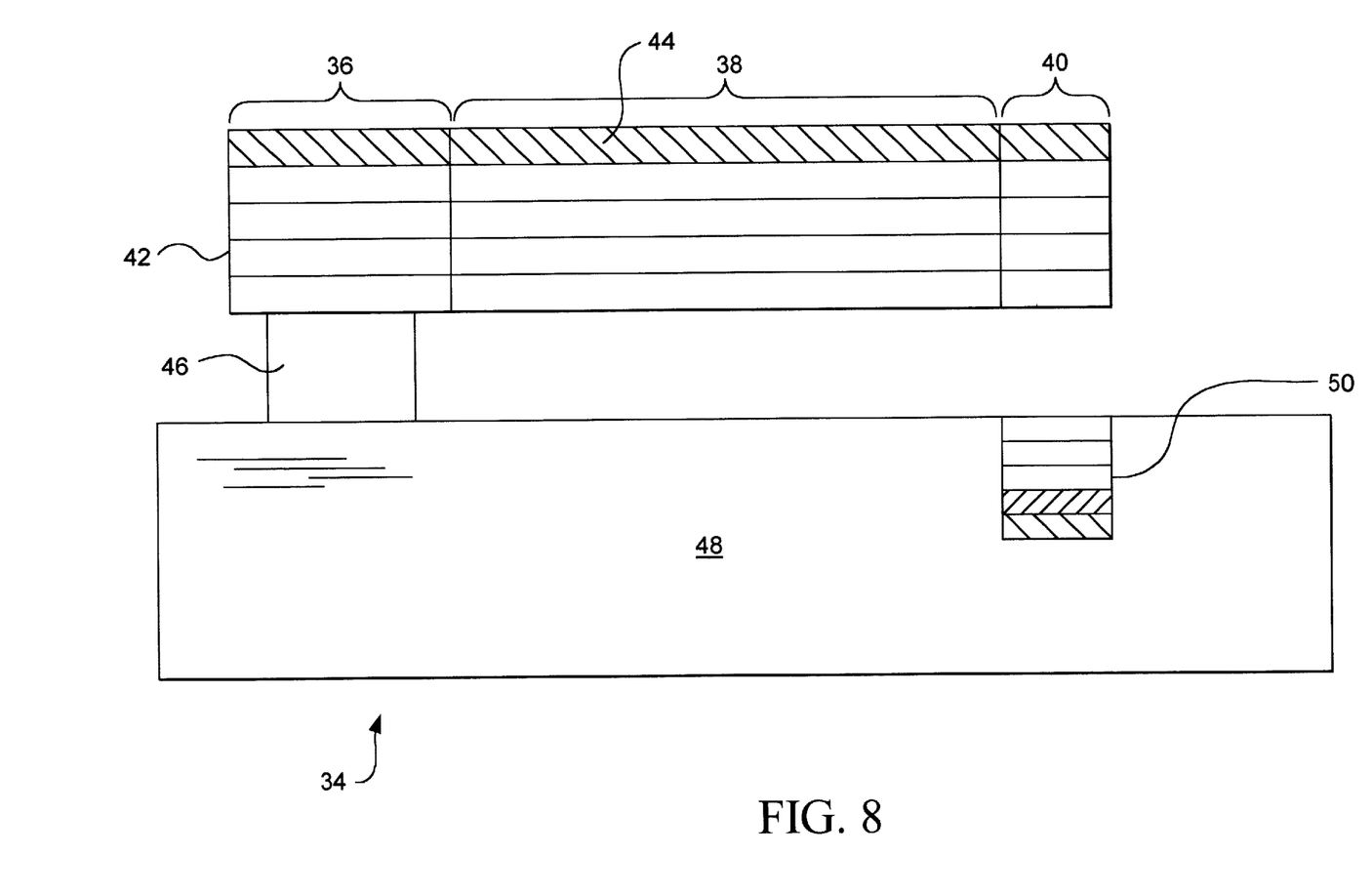
FIG. 8 is a side perspective view of a micro-optoelectronic device that is VCSEL.

In one embodiment of the invention, illustrated in FIG. 8, device 14 is a tunable semiconductor laser with a VCSEL laser 14 that is a cantilever apparatus that uses an electrostatic force that pulls on a cantilever arm. The mechanical deflection resulting from this electrostatic force is used to change the length of a Fabry-Perot microcavity of laser 14 and consequently to the resonance wavelength.

Laser 34 has a cantilever structure consisting of a base 36, an arm 38 and an active head 40. The bulk of cantilever structure may consist of a plurality of reflective layers 42 which form a distributed Bragg reflector (DBR). Layers 42 can be formed of different materials including but not limited to AlGaAs. Different compositional ratios are used for individual layers 42, e.g., $Al_{.09}Ga_{0.91}As/Al_{0.58}Ga_{0.42}As$. The topmost layer of layers 42 is heavily doped to ensure good contact with an electrical tuning contact 44 deposited on top of the cantilever structure.

The actual number of layers 42 may vary from 1 to 20 and more, depending on the desired reflectivity of the DBR. Furthermore, any suitable reflecting material other than AlGaAs may be used to produce layers 42. Active head 40 is made of layers. However, arm 38 and base 36 do not need to be made of layers.

Base 36 can have a variety of different geometric configurations and large enough to maintain dimensional stability of the cantilever structure. The width of arm 38 ranges typically from 2 to 8 microns while its length is 25 to 100 mu m or more. The stiffness of arm 38 increases as its length decreases. Consequently, shorter cantilevers require greater forces to achieve bending but shorter cantilevers also resonate at a higher frequency. The preferred diameter of active head 40 falls between 5 and 40 microns. Other dimensions are suitable.

Electrical tuning contact 44 resides on all or only a portion of a top of the cantilever structure. Electrical tuning contact 44 be sufficiently large to allow application of a first tuning voltage $V_{t1}$. A support 46 rests on a substrate 48 across which a voltage can be sustained. Substrate 48 can include a second DBR 50. Support 46 can be made of the same material as layers 42. A voltage difference between layers 42 and substrate 48 causes a deflection of arm 38 towards substrate 48. If layers 42 and substrate 48 are oppositely doped, then a reverse bias voltage can be established between them. Substrate 48 is sufficiently thick to provide mechanical stability to the entire cantilever apparatus. Inside substrate 48 and directly under active head 40 are one or more sets of reflective layers with each set forming a second DBR. A more complete description of the cantilever apparatus is disclosed in U.S. Pat. No. 5,629,951, incorporated herein by reference.

Figure 9:
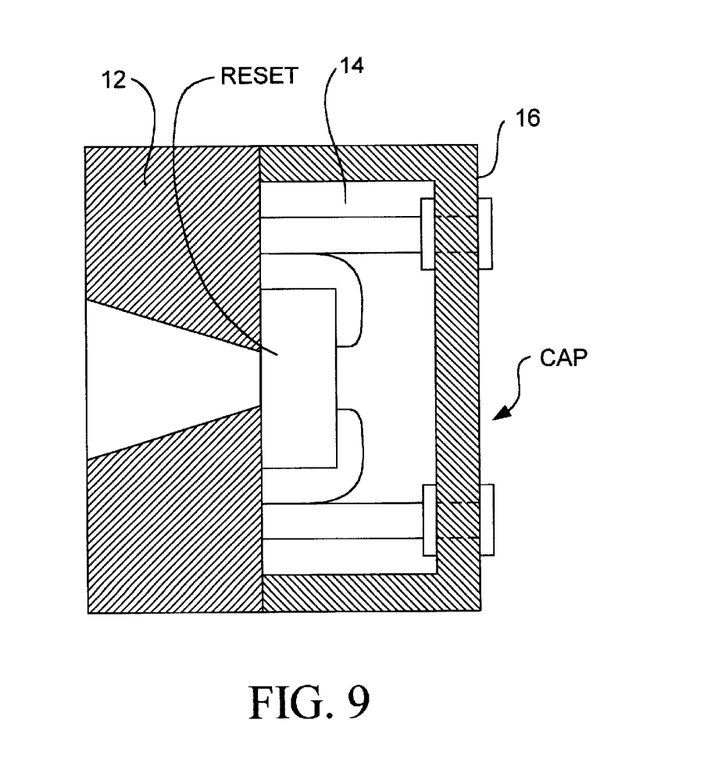
FIG. 9 illustrates one embodiment of the present invention with a heat sink coupled to the a VCSEL.

Referring now to FIG. 9, device 14 can be positioned on substrate 12 which is a heatsink can then be sealed with cap 16. When device 14 is a semiconductor laser, including but not limited to a VCSEL, a window is formed in heatsink 12. Heatsink 12 is an excellent thermal conductivity and electrical insulator. Additionally, positioned on surface 20, it can be a photodetector or other device, as previously described.

All devices 14 disclosed in this application can be utilized as in the multiplexers or de-multiplexers of U.S. Patent Applications, APPLICATION Ser. No. 09/326,127 and APPLICATION Ser. No. 09/326,767, filed on the same date as this application, and incorporated herein by reference.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A tunable semiconductor laser assembly, comprising:
   a laser including a seal surface, a semiconductor active region positioned between upper and lower confining regions of opposite type semiconductor material, first and second reflective members positioned at opposing edges of the active and confining regions; and
   a seal cap including a seal ring, wherein the seal cap seal ring is coupled to the seal surface to form a hermetic seal.

2. The assembly of claim 1, further comprising:
   a semiconductor device coupled to the seal cap, wherein the laser and the semiconductor device are each in a hermetically sealed housing defined by the seal cap and the laser.

3. The assembly of claim 2, wherein the semiconductor device is selected from a photodiode, a filter a tunable filter, and a semiconductor device with driver circuitry.

4. The laser assembly of claim 1, further comprising:
   a joining material coupling the seal cap seal ring to the seal surface.

5. The laser assembly of claim 4, wherein the joining material is an electrically conductive material.

6. The assembly of claim 1, wherein the laser further includes a first and a second electrical contact pad positioned at a surface of the laser.

7. The assembly of claim 1, wherein the first and a second electrical contact pad are positioned at a surface of the laser adjacent to the active area.

8. The assembly of claim 1, wherein the seal cap includes a first and a second electrical contact pads formed on an interior surface of the seal cap, and the laser includes first and second electrical contacts positioned to be engaged with seal caps first and second electrical contact pads.

9. The assembly of claim 8, wherein the laser first and second contact pads are made of a first material, and the seal cap first and second contact pads are made of a second material.

10. The assembly of claim 9, wherein the first and second materials are joined and form an alloy.

11. The assembly of claim 9, wherein the first material includes gold and the second material includes tin.

12. The assembly of claim 8, wherein the seal cap includes a conductive via positioned in the seal cap, wherein the first and second electrical pads of the laser and the seal cap are coupled to the conductive via.

13. The assembly of claim 8, further comprising:
   an energy source coupled to the conductive via.

14. The assembly of claim 1, wherein the seal cap is made of a transparent material.

15. The assembly of claim 1, wherein the seal cap is made of sapphire.

16. The assembly of claim 1, wherein the seal cap includes conductive traces.

17. The assembly of claim 1, wherein the seal cap includes a ceramic with conductive traces.

18. The assembly of claim 1, wherein the seal cap is a multilayer ceramic that includes conductive traces.

19. A tunable semiconductor laser assembly, comprising:
a heatsink;
a laser coupled to the heatsink, the laser including a semiconductor active region positioned between upper and lower confining regions of opposite type semiconductor material, first and second reflective members positioned at opposing edges of the active and confining regions; and
a seal cap including a seal ring, wherein the seal cap seal ring is coupled to the seal surface to form a hermetic seal.

20. The assembly of claim 19, further comprising:
a semiconductor device coupled to the seal cap, wherein the laser and the semiconductor device are each in a hermetically sealed housing defined by the seal cap and the laser.

21. The assembly of claim 20, wherein the semiconductor device is selected from a photodiode, a filter a tunable filter, and a semiconductor device with driver circuitry.

22. The assembly of claim 19, wherein the heatsink includes first and second electrical contact pads, and a conductive via coupled to the first and second electrical contact pads.

23. The assembly of claim 19, further comprising:
a photodiode positioned to receive an output from the laser.

24. A tunable semiconductor laser assembly, comprising:
a laser including,
an electrically responsive substrate including a substrate seal ring;
a support block positioned on the electrically responsive substrate;
a top reflecting member and a bottom reflecting member;
a cantilever structure including a base section resting on the support block, a deformable section extending above the electrically responsive substrate and creating an air gap between the deformable section and the electrically responsive substrate, and an active head positioned at a predetermined location on the deformable section and including at least a portion of the top reflecting member; and
a seal cap including a seal ring, wherein the seal cap seal ring is coupled to the substrate seal ring and form a hermetic seal.

25. The assembly of claim 24, further comprising:
a semiconductor device coupled to the seal cap, wherein the laser and the semiconductor device are each in a hermetically sealed housing defined by the seal cap and the laser.

26. The assembly of claim 25, wherein the semiconductor device is selected from a photodiode a filter, a tunable filter, and a semiconductor device with driver circuitry.

27. The laser assembly of claim 24, further comprising:
a joining material coupling the seal cap seal ring to the substrate seal ring.

28. The laser assembly of claim 27, wherein the joining material is an electrically conductive material.

29. The assembly of claim 24, wherein the laser further includes a first and a second electrical contact pad positioned at a surface of the laser.

30. The assembly of claim 24, wherein the first and a second electrical contact pads are positioned at a surface of the laser adjacent to the active area.

31. The assembly of claim 24, wherein the seal cap includes a first and a second electrical contact pads formed on an interior surface of the seal cap, and the laser includes first and second electrical contacts positioned to be engaged with seal caps first and second electrical contact pads.

32. The assembly of claim 31, wherein the seal cap includes a conductive via positioned in the seal cap, wherein the first and second electrical pads of the laser and the seal cap are coupled to the conductive via.

33. A wafer assembly, comprising:
a wafer substrate;
a plurality of optoelectrical devices positioned on a surface of the wafer substrate, each of an optoelectrical device including a seal surface; and
a plurality of seal caps, each of a seal cap including a seal ring, wherein the seal cap seal ring is coupled to a seal surface of an optoelectrical device and form a hermetic seal.

34. The assembly of claim 33, further comprising:
a semiconductor device coupled to the seal cap, wherein the laser and the semiconductor device are each in a hermetically sealed housing defined by the seal cap and the laser.

35. The assembly of claim 34, wherein the semiconductor device is selected from a photodiode, a filter a tunable filter, and a semiconductor device with driver circuitry.

36. The assembly of claim 33, wherein the optoelectrical device is a semiconductor laser.

37. The assembly of claim 33, wherein the optoelectrical device is a photodiode.

38. The assembly of claim 33, wherein the optoelectrical device is a tunable photodiode.

39. The assembly of claim 33, further comprising:
a joining material coupling the seal cap seal ring to the seal surface.

40. The assembly of claim 39, wherein the joining material is an electrically conductive material.

41. The assembly of claim 33, wherein each of an optoelectronic device further includes a first and a second electrical contact pad positioned at a surface of the optoelectrical device.

42. The assembly of claim 33, wherein the first and a second electrical contact pad are positioned at a surface of the optoelectrical device adjacent to the active area.

43. The assembly of claim 33, wherein each of a seal cap includes a first and a second electrical contact pads formed on an interior surface of the seal cap, and each of an optoelectrical device includes first and second electrical contacts positioned to be engaged with a seal cap's first and second electrical contact pads.

44. The assembly of claim 33, wherein each of a seal cap includes a conductive via positioned in the seal cap.

45. A wafer assembly, comprising:
a wafer substrate;
a plurality of micro-optomechanical devices positioned on a surface of the wafer substrate, each of a micro-optoelectrical device including a seal surface; and
a plurality of seal caps, each of a seal cap including a seal ring, wherein the seal cap seal ring is coupled to a seal surface of a micro-optomechanical device and form a hermetic seal.

46. The assembly of claim 45, further comprising:

a semiconductor device coupled to the seal cap, wherein the laser and the semiconductor device are each in a hermetically sealed housing defined by the seal cap and the laser.

47. The assembly of claim 46, wherein the semiconductor device is selected from a photodiode, a filter a tunable filter, and a semiconductor device with driver circuitry.

48. The assembly of claim 45, each of a micro-optomechanical device of the plurality includes a cantilever tuner.

49. The assembly of claim 45, further comprising:

a joining material coupling the seal cap seal ring to the seal surface.

50. The assembly of claim 49, wherein the joining material is an electrically conductive material.

51. The assembly of claim 45, wherein each of an optomechanical device further includes a first and a second electrical contact pad positioned at a surface of the micro-optomechanical device.

52. The assembly of claim 45, wherein the first and a second electrical contact pad are positioned at a surface of the micro-optomechanical device adjacent to the active area.

53. The assembly of claim 45, wherein each of a seal cap includes a first and a second electrical contact pads formed on an interior surface of the seal cap, and each of a micro-optomechanical device includes first and second electrical contacts positioned to be engaged with a seal cap's first and second electrical contact pads.

54. The assembly of claim 45, wherein each of a seal cap includes a conductive via positioned in the seal cap.

55. An array of tunable semiconductor laser assemblies, comprising:

an array of lasers, each of a laser including a seal surface, a semiconductor active region positioned between upper and lower confining regions of opposite type semiconductor materials, first and second reflective members positioned at opposing edges of the active and confining regions; and an array of seal caps, each of a seal cap including a seal ring, wherein each seal cap seal ring is coupled to the seal surface of the laser to form a hermetic seal.

* * * * *